US008674316B1

(12) United States Patent
Pralle et al.

(10) Patent No.: US 8,674,316 B1
(45) Date of Patent: Mar. 18, 2014

(54) ELECTROMAGNETIC RADIATION IMAGING DEVICES AND ASSOCIATED METHODS

(71) Applicant: SiOnyx, Inc., Beverly, MA (US)

(72) Inventors: Martin U. Pralle, Wayland, MA (US); James E. Carey, Waltham, MA (US); Stephen D. Saylor, Annisquam, MA (US)

(73) Assignee: Sionyx, Inc., Beverly, MA (US)

( * ) Notice: Subject to any disclaimer, the term of this patent is extended or adjusted under 35 U.S.C. 154(b) by 0 days.

(21) Appl. No.: 13/932,994

(22) Filed: Jul. 1, 2013

Related U.S. Application Data

(63) Continuation of application No. 12/872,932, filed on Aug. 31, 2010, now Pat. No. 8,476,598.

(60) Provisional application No. 61/238,517, filed on Aug. 31, 2009, provisional application No. 61/238,523, filed on Aug. 31, 2009, provisional application No. 61/238,526, filed on Aug. 31, 2009, provisional application No. 61/259,953, filed on Nov. 10, 2009.

(51) Int. Cl.
*H01L 27/146* (2006.01)

(52) U.S. Cl.
USPC ............................................. 250/370.09

(58) Field of Classification Search
USPC ................. 250/338.1–338.5, 370.01–370.15
See application file for complete search history.

(56) References Cited

U.S. PATENT DOCUMENTS 4,568,960 A * 2/1986 Petroff et al. .............. 257/458
4,883,962 A * 11/1989 Elliott ...................... 250/334

* cited by examiner

*Primary Examiner* — Kiho Kim
(74) *Attorney, Agent, or Firm* — Thorpe North & Western LLP

(57) ABSTRACT

Electromagnetic radiation detection systems and associated methods are provided. In one aspect, for example, an electromagnetic radiation detection system includes a semiconductor material operable to detect electromagnetic radiation, the semiconductor material having a responsivity of greater than or equal to 0.3 A/W at an operating voltage of less than or equal to about 50 volts and at a wavelength of from about 0.01 nm to about 100 nm. The system can further include an electromagnetic radiation source positioned to deliver electromagnetic radiation to the semiconductor material.

22 Claims, 4 Drawing Sheets

ELECTROMAGNETIC RADIATION IMAGING DEVICES AND ASSOCIATED METHODS

PRIORITY DATA

This application is a continuation of U.S. patent application Ser. No. 12/872,932, filed on Aug. 31, 2010, which claims the benefit of U.S. Provisional Patent Application Ser. No. 61/238,517, filed on Aug. 31, 2009, U.S. Provisional Patent Application Ser. No. 61/238,523, filed on Aug. 31, 2009, U.S. Provisional Patent Application Ser. No. 61/238,526, filed on Aug. 31, 2009, and U.S. Provisional Patent Application Ser. No. 61/259,953, filed on Nov. 10, 2009, each of which is incorporated herein by reference.

BACKGROUND

X-ray imaging devices have previously been used as non-invasive medical analyzing devices. In some cases, such medical imaging is performed by placing a subject's body part near an x-ray sensitive film while exposing the body part and the film to x-rays. The x-rays thus expose a monochromatic image on the film corresponding to the body part. Areas of the film exposed to more x-ray radiation appear darker on the film and areas exposed to less radiation appear lighter. Dense material, such as bone, blocks or absorbs a greater portion of the x-rays as compared to less dense material, and thus generates white regions on the image while less dense tissue surrounding the bone appears gray or black. Films have been developed to improve the resolution and detail of the x-ray image as well as reduce the amount of x-ray radiation exposed to the subject. In an effort to improve such analytic imaging properties, the Computer Tomography (CT) scan, Positron Emission Tomography (PET) scan, Magnetic Resonance Imaging (MRI), as well as other imaging device and techniques have been developed. Many such devices have limitations, however. For example, while image quality may be enhanced compared to x-ray film techniques, a significantly higher dosage of x-rays is delivered to the subject. In some cases, for example, the subject may be exposed to as much as 6000 mRem for a CT scan.

Digital imaging has been developed to employ detectors that are configured to detect x-rays or electromagnetic radiation having wavelengths in the range of about 0.01 nanometers to about 10 nanometers. Typically such detectors include a photodiode and a scintillator. Scintillators function by converting impinging x-rays into photons of visible light. This visible light is emitted by the scintillator and is detected by the photodiode, and thus is converted into an electrical signal that can be digitized and used to create a digital image.

Scintillators when used in combination with a photomultiplier tube (PMT) or an avalanche photodiode (APD) can enhance the detection characteristics of the system. PMTs are detectors that are very sensitive to light in the ultraviolet, visible, and near-infrared regions. PMTs function by multiplying the current produced by light incident on the tube by as much as 100 million times, which can enable individual photons to be detected when the incident flux of light is very low. APDs work by applying a high reverse bias voltage, typically around 200V, to the device. The high voltage creates a strong electrical field that can generate multiple electrons per incident photon on the device, also known as internal current gain. PMTs and APDs present large integration challenges for the equipment manufactures as these devices can require drive voltages in excess of 300V to extract sufficient signal for measurement.

Scintillator devices, however, often suffer from drawbacks such as limited responsivity, limited spectral detectability, and performance degradation due to factors such as the Staebler-Wronski Effect (SWE). In some cases, x-rays passing through a scintillator material can be affected by fluorescence/phosphorescence effects and optical scattering, thus causing spatial blurring and signal to noise limitations that can ultimately degrade image quality, and thus may not be desired for some types of radiography. Digital imaging device have been developed that exclude the use of scintillators.

Amorphous selenium flat-panels, for example, are able to capture and convert x-ray energy directly into electronic signals without the aid of a wavelength converting material such as a scintillator. However, such devices also have limitations, particularly in terms of responsivity, temperature range, longevity, and application use. Limited responsivity and spectral detection can relate directly to degrade image quality. Further, the Staebler-Wronski effect can have a negative impact after several hours of use on devices that include amorphous semiconductor materials. It is understood that the Staebler-Wronski Effect impacts amorphous semiconductor materials by changing the properties of hydrogenated amorphous silicon (a-Si:H) or non-hydrogenated amorphous silicon. The defect density of the a-Si compound increases with light exposure, thus causing an increase in recombination occurrences, and leading to the reduction in incident electromagnetic radiation to electricity conversion efficiency.

Furthermore, amorphous selenium detectors typically have a narrow operating or stagnant temperature range. In order for such devices to work properly, selenium detectors often need to be maintained within a temperature range of between about 5° C. and 30° C.; operating outside this range can have a detrimental effect on the selenium. Selenium can also generate ghost images if x-ray source energies in the range of 180 keV or more are applied. In addition, the lifetime of the selenium flat-panels can be relatively short, in some cases less than 2 years.

SUMMARY

The present disclosure provides electromagnetic radiation detection systems and associated methods. In one aspect, for example, an electromagnetic radiation detection system includes a semiconductor material operable to detect electromagnetic radiation, the semiconductor material having a responsivity of greater than or equal to 0.3 A/W at an operating voltage of less than or equal to about 50 volts and at a wavelength of from about 0.01 nm to about 100 nm. In another aspect the semiconductor material has a responsivity of greater than or equal to 0.3 A/W at an operating voltage of less than or equal to about 50 volts and at a wavelength of from about 0.01 nm to about 50 nm. In yet another aspect the semiconductor material has a responsivity of greater than or equal to 0.4 A/W at an operating voltage of less than or equal to about 50 volts and at a wavelength of from about 0.01 nm to about 100 nm. In a further aspect, the semiconductor material as a responsivity of greater than or equal to 0.7 A/W at an operating voltage of less than or equal to about 50 V and a wavelength of from about 0.01 nm to about 100 nm. Additionally, in one aspect the operating voltage is less than or equal to about 15 volts. In yet another aspect the operating voltage is less than or equal to about 10 volts.

An electromagnetic radiation source can be utilized to deliver electromagnetic radiation to the semiconductor material. As such, in one aspect an electromagnetic radiation source is positioned to deliver to the semiconductor material a quantity of electromagnetic radiation having a wavelength of from about 0.01 nm to about 100 nm. In some cases the semiconductor material can be processed to further enhance the electromagnetic radiation detection properties of the semiconductor material. In one aspect, for example, the semiconductor material includes a laser treated region. In another aspect the laser treated region is doped with a dopant. Nonlimiting examples of dopants for silicon semiconductors include group II, group III, group V, and group VI materials, including combinations thereof. Annealing processes can also be beneficial. In one aspect, for example, the semiconductor material can be annealed to a temperature of about 300° C. to about 1100° C.

Various semiconductor materials are also contemplated, and any semiconductor allowing electromagnetic radiation detection functionality according to aspects of the present disclosure are considered to be within the present scope. Nonlimiting examples of such semiconductor materials can include group IV materials, compounds and alloys comprised of materials from groups II and VI, compounds and alloys comprised of materials from groups III and V, and combinations thereof. In one specific aspect the semiconductor material is comprised of silicon. Various silicon semiconductor manufacturing processes can also be utilized, nonlimiting examples of which include float zone (FZ), Magnetic Czochralski (MCZ), Czochralski (CZ) and like processes. Additionally, it can be beneficial to utilize semiconductor material having a low oxygen content. In one aspect, for example, the semiconductor material has an oxygen content of less than or equal to 50 ppm atomic. Furthermore, any thickness of semiconductor material that can function according to aspects of the present disclosure is considered to be within the present scope. In one specific aspect, for example, the semiconductor material has a thickness of from about 500 nm to about 50 μm. In another specific aspect, the semiconductor material has a thickness of from about 2 μm to about 10 μm.

In another aspect of the present disclosure, an electromagnetic radiation detection system is provided. Such a system can include a wavelength converting material operable to absorb a first electromagnetic radiation wavelength in a range of from about 0.01 nm to about 100 nm and emit a second electromagnetic radiation wavelength in a range of from greater than about 100 nm to about 1500 nm, and a semiconductor material operable to detect electromagnetic radiation. The semiconductor material is positioned relative to the wavelength converting material to receive the second electromagnetic radiation wavelength. Additionally, the semiconductor material has a responsivity of greater than or equal to 0.8 A/W at an operating voltage of less than or equal to about 50 volts and at a wavelength of from about 100 nm to about 1500 nm. In another aspect, the semiconductor material has a responsivity of greater than or equal to 0.8 A/W at an operating voltage of less than or equal to about 50 volts and at a wavelength of from about 400 nm to about 1100 nm. In yet another aspect, the operating voltage is less than or equal to about 15 volts. In a further aspect, the semiconductor material is configured as a photosensitive diode, a photosensitive diode array, a thin film transistor, or the like.

In yet another aspect of the present disclosure, a method for reducing electromagnetic radiation exposure to a subject can include providing an electromagnetic radiation detection system including a semiconductor photodetector material operated at less than 50 volts and configured to generate a responsivity greater than 0.3 A/W at a wavelength in the range of about 0.01 nm to about 100 nm, exposing at least a portion of a subject with a sufficient amount of electromagnetic x-ray radiation to generate an electrical response within the semiconductor photodetector material, and generating an image from the electrical response of the semiconductor photodetector material. In one aspect, the sufficient amount of electromagnetic x-ray radiation is reduced by at least 5% as compared to a semiconductor photodetector material operated at greater than 50 V. In another aspect, the sufficient amount of electromagnetic x-ray radiation is reduced by at least 10% as compared to a semiconductor photodetector material operated at greater than 50 V.

DETAILED DESCRIPTION

Figure 1:
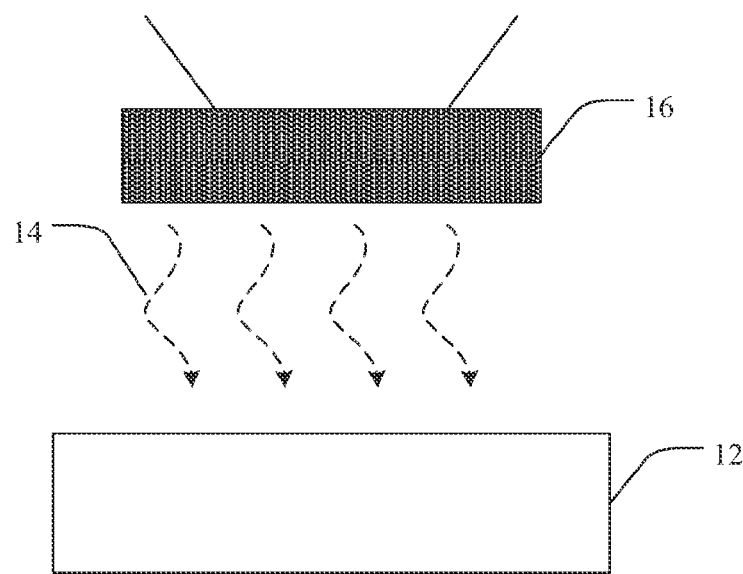
FIG. 1 is a schematic view of an electromagnetic imaging device in accordance with one aspect of the present disclosure.

Before the present disclosure is described herein, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

DEFINITIONS

In describing and claiming the present invention, the following terminology will be used in accordance with the definitions set forth below.

It should be noted that, as used in this specification and the appended claims, the singular forms "a," and, "the" include plural referents unless the context clearly dictates otherwise. Thus, for example, reference to "a dopant" includes one or more of such dopants and reference to "the layer" includes reference to one or more of such layers.

As used herein, the term "low oxygen content" refers to any material having an interstitial oxygen content that is less than or equal to about 60 ppm atomic.

As used herein, the terms "disordered surface" and "textured surface" can be used interchangeably, and refer to a surface having a topology with nano- to micron-sized surface variations formed by the irradiation of laser pulses. While the characteristics of such a surface can be variable depending on the materials and techniques employed, in one aspect such a surface can be several hundred nanometers thick and made up of nanocrystallites (e.g. from about 10 to about 50 nanometers) and nanopores. In another aspect, such a surface can include micron-sized structures (e.g. about 2 μm to about 60

μm). In yet another aspect, the surface can include nano-sized and/or micron-sized structures from about 5 nm and about 500 μm.

As used herein, the term "fluence" refers to the amount of energy from a single pulse of laser radiation that passes through a unit area. In other words, "fluence" can be described as the energy density of one laser pulse.

As used herein, the terms "surface modifying" and "surface modification" refer to the altering of a surface of a semiconductor material using laser radiation. In one specific aspect, surface modification can include processes using primarily laser radiation or laser radiation in combination with a dopant, whereby the laser radiation facilitates the incorporation of the dopant into a surface of the semiconductor material. Accordingly, in one aspect surface modification includes doping of a semiconductor material.

As used herein, the term "target region" refers to an area of a semiconductor material that is intended to be doped or surface modified using laser radiation. The target region of a semiconductor material can vary as the surface modifying process progresses. For example, after a first target region is doped or surface modified, a second target region may be selected on the same semiconductor material.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

THE DISCLOSURE

The present disclosure provides electromagnetic radiation detection systems, devices, and associated methods that increase the overall performance of imagers while reducing overall system complexity and decreasing the amount of radiation often used to produce an image from a subject. More specifically, the present disclosure relates to semiconductor photodiodes that are capable of directly or indirectly detecting electromagnetic radiation in the x-ray range and outputting an electrical signal in response to the detected x-rays. Thus, electromagnetic radiation can be detected within the range of about 0.01 nm to about 100 nm, wavelength converted into a range of from about 100 nm to about 1500 nm, converted into an electrical signal, which can then be used to generate an image.

In those aspects of the present disclosure lacking a wavelength converting material such as a scintillator, the detection of electromagnetic radiation within the range of about 0.01 nm to about 100 nm and the subsequent conversion of this radiation into an electrical signal is accomplished within the semiconductor device itself. In those aspects of the present disclosure including a wavelength converting material, electromagnetic radiation within that range of about 0.01 nm to about 100 nm impinge on the wavelength converting material, is wavelength converted into a range of from about 100 nm to about 1500 nm, and as emitted from the wavelength converting material. This emitted electromagnetic radiation is detected by a photosensitive semiconductor device, which results in the generation of an electrical signal that can be used to generate an image. Thus, the wavelength converting material is used to absorb electromagnetic radiation having a wavelength in the x-ray range, convert at least a portion of x-ray photons impinging on the material to a longer wavelength, and delivering the longer wavelength electromagnetic radiation to a photosensitive semiconductor device.

One problem with some current devices relates to their limited optical responsivity, which in turn can affect image quality. Responsivity can be defined as ratio of photocurrent generated to an incident optical/light power level, typically expressed in amps per watt (A/W). In addition to limited responsivity, current semiconductor devices often lack the ability to detect a wide spectrum of wavelengths, mainly detecting in the visible spectrum only. As a result, scintillators that emit converted electromagnetic radiation in the visible spectrum (i.e. about 400 nm to about 600 nm) are used. Photosensitive semiconductor materials of the present disclosure, however, are able to detect electromagnetic radiation over a much wider range, and are thus more responsive to electromagnetic radiation from 0.01 nm to 1500 nm at least. In those aspects whereby a wavelength converting material is used, scintillators having a much wider emission spectrum as compared to the prior art can be utilized effectively with higher responsivity. It should be kept in mind, however, that the wide detection spectrum of the photosensitive semiconductor can be used to absorb electromagnetic radiation and output an electrical signal in systems that include scintillator materials and in systems that don't include scintillator materials.

Accordingly, the present disclosure provides systems, devices, and associated methods for detecting electromagnetic radiation. In some cases, these systems, devices, and methods can be used to generate an image of the least a body part of the subject. In one aspect, as is shown in FIG. 1, an electromagnetic radiation detection system can include a semiconductor material 12 operable to detect electromagnetic radiation 14, where the semiconductor material has a responsivity of greater than or equal to 0.3 A/W at an operating voltage of less than or equal to about 50 volts and at a wavelength of from about 0.01 nm to about 100 nm. In a more specific aspect, the semiconductor material has a responsivity of greater than or equal to 0.3 A/W at an operating voltage of less than or equal to about 50 volts and at a wavelength of from about 0.01 nm to about 50 nm. In another more specific aspect, the semiconductor material has a responsivity of greater than or equal to 0.4 A/W at an operating voltage of less than or equal to about 50 volts and at a wavelength of from about 0.01 nm to about 100 nm. In yet another more specific aspect, the semiconductor material has a responsivity of greater than or equal to 0.7 A/W at an operating voltage of less than or equal to about 50 volts and at a wavelength of from about 0.01 nm to about 100 nm. The operating voltage can be expressed as a bias applied to the device. Bias is defined as the application of an external electrical voltage to the device allowing charge to flow across a junction(s) of the device. The bias can be a forward bias or a reverse bias. It should be noted that in various aspects, the devices and semiconductor materials disclosed herein can have a responsivity greater than 1 A/W, 5 A/W, or greater than 50 A/W.

As has been described, devices and systems according to aspects of the present invention can be operated at voltages that are significantly lower than many previous electromagnetic detection designs. In one aspect, for example, the operating voltage of the semiconductor material (e.g. photodiode, photodiode array, and the like) is from about 0 V to about 50 V. In another aspect, the operating voltage is from about 1 V to about 15 V. In yet another aspect, the operating voltage is from about 5 V to about 10 V.

In another aspect, also shown in FIG. 1, the system can include an electromagnetic radiation source 16 positioned to deliver to the semiconductor material 12 a quantity of electromagnetic radiation 14 having a wavelength of from about 0.01 nm to about 100 nm. The generation of electromagnetic radiation is known, and the present scope should not be limited to a specific radiation source or generation technique.

Figure 2:
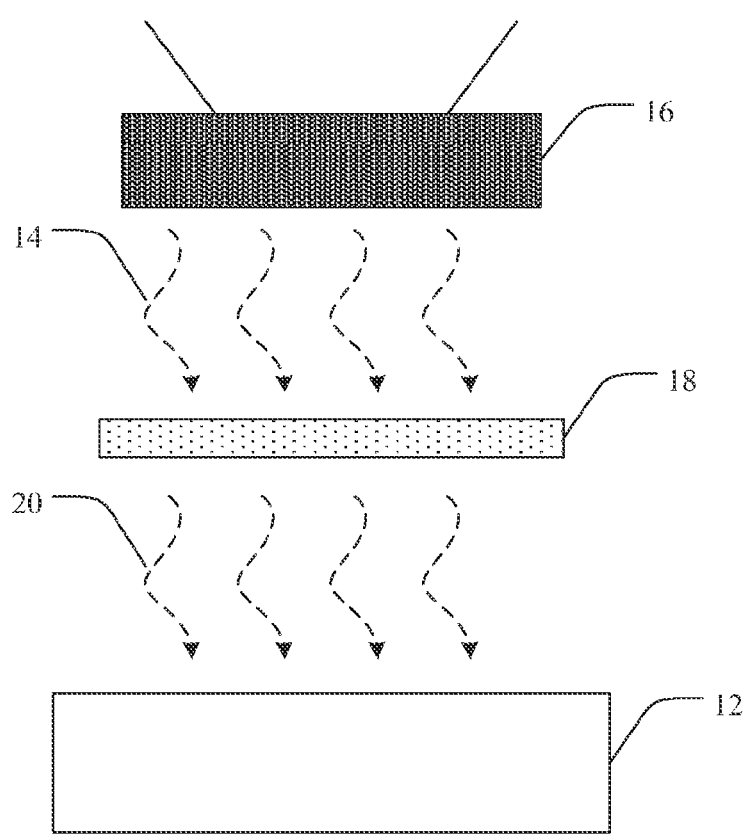
FIG. 2 is a schematic view of an electromagnetic imaging device in accordance with another aspect of the present disclosure.

In some aspects of the present disclosure, a wavelength converting material such as a scintillator can be included in a device or system. As is shown in FIG. 2, for example, a wavelength converting material 18 is disposed between the semiconductor material 12 and the electromagnetic radiation source 16. The, electromagnetic radiation 14 having a wavelength of about 0.01 nm to about 100 nm is delivered from the electromagnetic radiation source to the wavelength converting material. The wavelength converting material absorbs this shorter wavelength electromagnetic radiation and wavelength converts it to longer wavelength electromagnetic radiation 20 that is within the range of from greater than about 100 nm to about 1500 nm. In this case, the semiconductor material is operable to detect at least the longer wavelength electromagnetic radiation from about 100 nm to about 1500 nm, although the detection range of the semiconductor can be broader. As such, in one aspect the semiconductor material has a responsivity of greater than or equal to 0.8 A/W at an operating voltage of less than or equal to about 50 volts and at a wavelength of from at least about 100 nm to about 1500 nm. In another aspect the semiconductor material has a responsivity of greater than or equal to 0.8 A/W at an operating voltage of less than or equal to about 50 volts and at a wavelength of from about 400 nm to about 1100 nm.

Wavelength converting materials, or scintillators, are typically comprised of luminescent materials that, when impinged by x-ray radiation, absorb the radiation's energy and reemit the absorbed energy at a different wavelength, typically in the visible range. Most current scintillators reemit electromagnetic radiation in the range of from about 300 nm to about 500 nm. Other scintillators that emit radiation having wavelengths greater than 500 nm can also be used. Nonlimiting examples of wavelength converting materials can include thallium doped sodium iodide (NaI(TI)), europium doped calcium difluoride ($CaF_2(Eu)$), europium doped lithium iodide (LiI(EU)), thallium doped cesium iodide (CsI(TI)), sodium doped cesium iodide (CsI(Na)), cesium fluoride (CsF), calcium tungstate ($CaWO_4$), cadmium tungstate ($CdWO_4$), bismuth orthogermanate (($Bi_4GeO_{12}$)(BGO)), barium fluoride ($BaF_2$), gadolinium silicate (($Gd_2SiO_5$) (GSO)), cerium trifluoride ($CeF_3$), terbium doped gadolinium oxysulfide ($Gd_2O_2S$:Tb), cadmium telluride (CdTe), lead iodide ($PbI_2$), and the like. The present disclosure is not limited by the choice of scintillator material, and all such wavelength converting materials are considered to be within the present scope.

Figure 3:
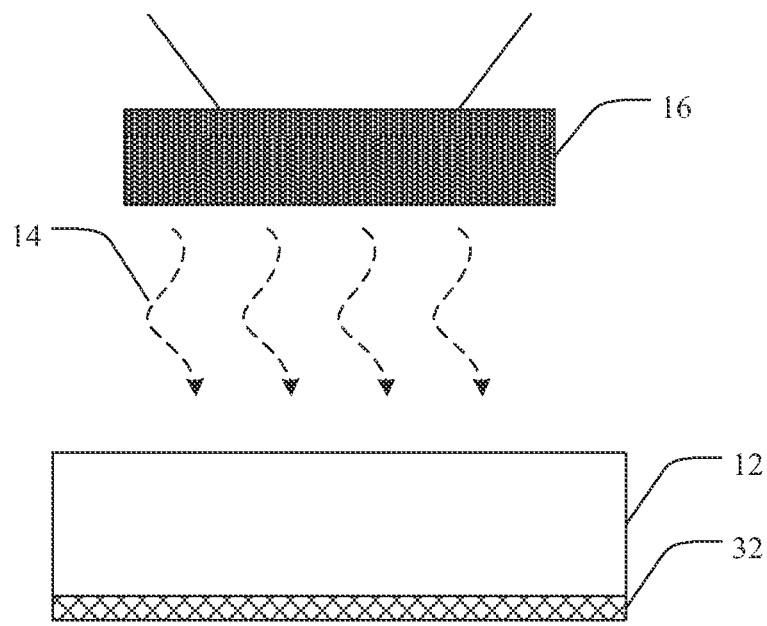
FIG. 3 is a schematic view of an electromagnetic imaging device in accordance with yet another aspect of the present disclosure.
Figure 4:
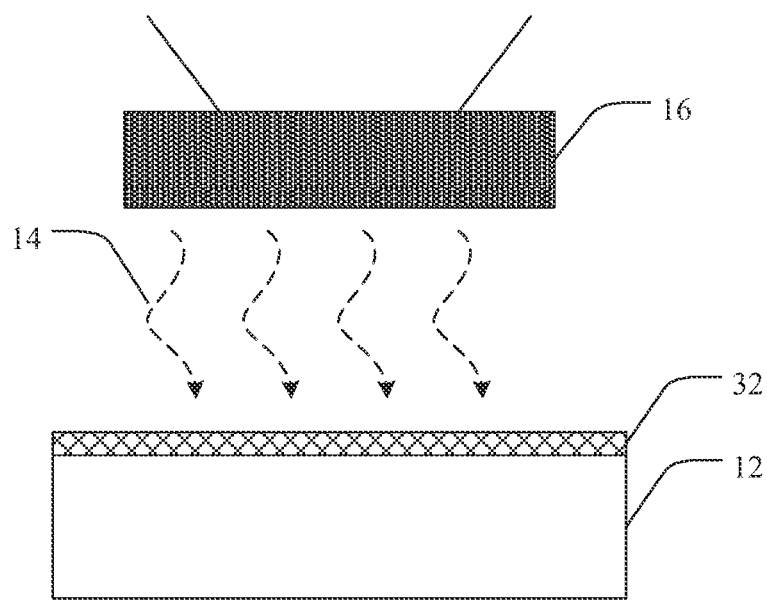
FIG. 4 is a schematic view of an electromagnetic imaging device in accordance with a further aspect of the present disclosure.
Figure 5:
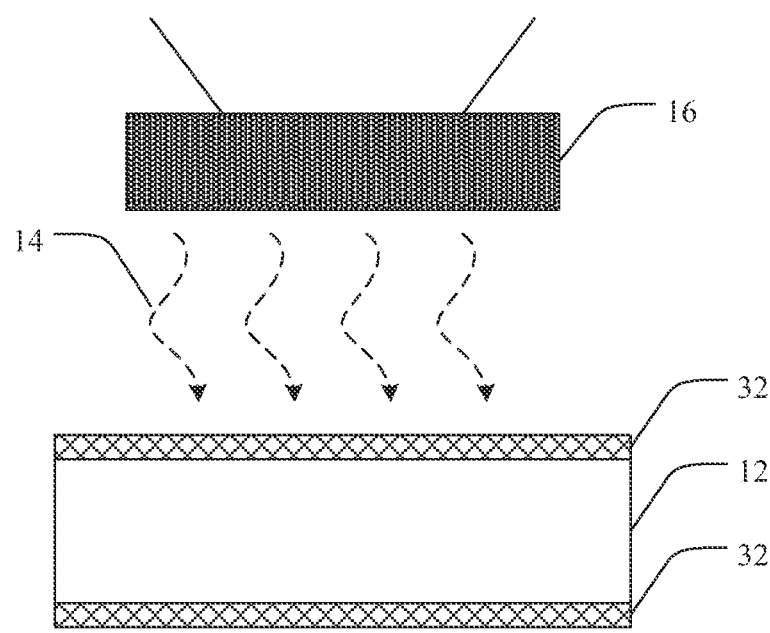
FIG. 5 is a schematic view of an electromagnetic imaging device in accordance with yet a further aspect of the present disclosure.

In some aspects, the efficiency of the electromagnetic radiation detecting semiconductor material can be improved by including a laser treated region. The laser treated region can be a portion of a surface of the semiconductor material, an entire surface of the semiconductor material, or multiple surfaces of the semiconductor material. In some aspects, the laser treated region can be portions of multiple surfaces of the semiconductor material. Additionally, it is also contemplated that the laser treated region can be located within the semiconductor material. The laser treatment can form a photonic junction or a shallow photonic junction. As is shown in FIG. 3, for example, a laser treated region 32 is coupled to the semiconductor material 12 at a surface that is opposite the electromagnetic radiation source 16. As is shown in FIG. 4, a laser treated region 32 is coupled to the semiconductor material on a surface facing the electromagnetic radiation source. As is shown in FIG. 5, multiple laser treated regions 32 are coupled to the semiconductor material, one on a surface that is opposite the electromagnetic radiation source and another on a surface facing the electromagnetic radiation source. Thus depending on the intended design of the electromagnetic radiation detection device, a laser treated region can be located on essentially any surface of the semiconductor material, or in some cases within the semiconductor. It should be noted that the aspects shown in FIGS. 3-5 can also include a wavelength converting material (not shown).

A variety of techniques of forming a laser treated region on the semiconductor material are contemplated, and any technique capable of forming such a region should be considered to be within the present scope. Laser treatment or processing can allow, among other things, enhanced light absorption properties and thus increased electromagnetic radiation detection. The laser treated surface can be associated with the surface nearest the impinging electromagnetic radiation, or the laser treated surface can be associated with a surface opposite in relation to impinging electromagnetic radiation, thereby allowing the radiation to pass through the semiconductor material before it hits the laser treated region.

In one aspect, for example, a target region of the semiconductor material can be irradiated with laser radiation to form a laser treated region. Examples of such processing have been described in further detail in U.S. Pat. Nos. 7,057,256, 7,354, 792 and 7,442,629, which are incorporated herein by reference in their entireties. Briefly, a surface of a semiconductor material is irradiated with laser radiation to form a textured or surface modified region. Such laser processing can occur with or without a dopant material. In those aspects whereby a dopant is used, the laser can be directed through a dopant carrier and onto the semiconductor surface. In this way, dopant from the dopant carrier is introduced into the target region of the semiconductor material. Such a region incorporated into a semiconductor material can have various benefits in accordance with aspects of the present disclosure. For example, the target region typically has a textured surface that increases the surface area of the laser treated region and increases the probability of radiation absorption. In one aspect, such a target region is a substantially textured surface including micron-sized and/or nano-sized surface features that have been generated by the laser texturing. In another aspect, irradiating the surface of semiconductor material includes exposing the laser radiation to a dopant such that irradiation incorporates the dopant into the semiconductor. Various dopant materials are known in the art, and are discussed in more detail herein.

Thus the surface of the semiconductor material is chemically and/or structurally altered by the laser treatment, which may, in some aspects, result in the formation of surface features appearing as microstructures or patterned areas on the surface and, if a dopant is used, the incorporation of such dopants into the semiconductor material. In some aspects, the features or microstructures can be on the order of 50 nm to 20 µm in size and can assist in the absorption of electromagnetic radiation. In other words, the textured surface can increase the probability of incident radiation being absorbed by the semiconductor material.

The type of laser radiation used to surface modify a semiconductor material can vary depending on the material and the intended modification. Any laser radiation known in the art can be used with the systems and methods of the present disclosure. There are a number of laser characteristics that can affect the surface modification process and/or the resulting product including, but not limited to the wavelength of the laser radiation, pulse width, pulse fluence, pulse frequency, polarization, laser propagation direction relative to the semiconductor material, etc. In one aspect, a laser can be configured to provide pulsatile lasing of a semiconductor material. A short-pulsed laser is one capable of producing femtosecond, picosecond and/or nanosecond pulse durations. Laser pulses can have a central wavelength in a range of about from about 10 nm to about 8 µm, and more specifically from about 200 nm to about 1200 nm. The pulse width of the laser radiation can be in a range of from about tens of femtoseconds to about hundreds of nanoseconds. In one aspect, laser pulse widths can be in the range of from about 50 femtoseconds to about 50 picoseconds. In another aspect, laser pulse widths are in the range of from about 50 to 500 femtoseconds.

The number of laser pulses irradiating a semiconductor target region can be in a range of from about 1 to about 2000. In one aspect, the number of laser pulses irradiating a semiconductor target region can be from about 2 to about 1000. Further, the repetition rate or frequency of the pulses can be selected to be in a range of from about 10 Hz to about 10 µHz, or in a range of from about 1 kHz to about 1 MHz, or in a range from about 10 Hz to about 1 kHz. Moreover, the fluence of each laser pulse can be in a range of from about 1 kJ/m$^2$ to about 20 kJ/m$^2$, or in a range of from about 3 kJ/m$^2$ to about 8 kJ/m$^2$.

The techniques according to the present disclosure also have the advantage of reducing the effects of the Straebler-Wronski Effect. The Staebler-Wronski Effect impacts amorphous semiconductor materials by changing the properties of hydrogenated amorphous silicon (a-Si:H) or non-hydrogenated amorphous silicon. The defect density of the a-Si compound increases with light exposure causing an increase in the recombination occurrences, leading to the reduction in incident electromagnetic radiation to electricity conversion efficiency. It is believed that laser processing the semiconductor material at or near melting and ablation temperatures improve the stability of the semiconductor material by recrystallizing or creating a laser crystallized portion within the amorphous material thereby reducing and/or eliminating the Staebler-Wronski Effect.

A variety of dopant materials are contemplated, and any such material that can be used in the laser treatment process to surface modify a semiconductor material according to aspects of the present disclosure is considered to be within the present scope. It should be noted that the particular dopant utilized can vary depending on the semiconductor material being laser treated, as well as the intended use of the resulting semiconductor material. For example, the selection of potential dopants may differ depending on whether or not a wavelength converting material is used in the system.

A dopant can be either electron donating or hole donating. In one aspect, non-limiting examples of dopant materials can include S, F, B, P, N, As, Se, Te, Ge, Ar, Ga, In, Sb, and combinations thereof. It should be noted that the scope of dopant materials should include, not only the dopant materials themselves, but also materials in forms that deliver such dopants (i.e. dopant carriers). For example, S dopant materials includes not only S, but also any material capable being used to dope S into the target region, such as, for example, $H_2S$, $SF_6$, $SO_2$, and the like, including combinations thereof. In one specific aspect, the dopant can be S. Sulfur can be present at an ion dosage level of between about $5 \times 10^{14}$ and about $1 \times 10^{16}$ ions/cm$^2$. Non-limiting examples of fluorine-containing compounds can include $ClF_3$, $PF_5$, $F_2SF_6$, $BF_3$, $GeF_4$, $WF_6$, $SiF_4$, HF, $CF_4$, $CHF_3$, $CH_2F_2$, $CH_3F$, $C_2F_6$, $C_2HF_5$, $C_3F_8$, $C_4F_8$, $NF_3$, and the like, including combinations thereof. Non-limiting examples of boron-containing compounds can include $B(CH_3)_3$, $BF_3$, $BCl_3$, BN, $C_2B_{10}H_{12}$, borosilica, $B_2H_6$, and the like, including combinations thereof. Non-limiting examples of phosphorous-containing compounds can include $PF_5$, $PH_3$, and the like, including combinations thereof. Non-limiting examples of chlorine-containing compounds can include $Cl_2$, $SiH_2Cl_2$, HCl, $SiCl_4$, and the like, including combinations thereof. Dopants can also include arsenic-containing compounds such as $AsH_3$ and the like, as well as antimony-containing compounds. Additionally, dopant materials can include mixtures or combinations across dopant groups, i.e. a sulfur-containing compound mixed with a chlorine-containing compound. In one aspect, the dopant material can have a density that is greater than air. In one specific aspect, the dopant material can include Se, $H_2S$, $SF_6$, or mixtures thereof. In yet another specific aspect, the dopant can be $SF_6$ and can have a predetermined concentration range of about $5.0 \times 10^{-8}$ mol/cm$^3$ to about $5.0 \times 10^{-4}$ mol/cm$^3$. $SF_6$ gas is a good carrier for the incorporation of sulfur into the semiconductor material via a laser process without significant adverse effects on the semiconductor material. Additionally, it is noted that dopants can also be liquid solutions of n-type or p-type dopant materials dissolved in a solution such as water, alcohol, or an acid or basic solution. Dopants can also be solid materials applied as a powder or as a suspension dried onto the wafer.

Additionally, in some aspects the dopant can be a material having a higher atomic weight than the semiconductor material. In another aspect, the dopant can include selenium, tellurium, polonium, arsenic, antimony, bismuth, and the like, including combinations thereof. In yet another aspect, the semiconductor material is silicon and the dopant can be a group II material, a group III material, a group V material, a group VI material, or a combination thereof.

A variety of semiconductor materials are contemplated for use with the systems, devices, and methods according to aspects of the present disclosure. Non-limiting examples of such semiconductor materials can include group IV materials, compounds and alloys comprised of materials from groups II and VI, compounds and alloys comprised of materials from groups III and V, and combinations thereof. More specifically, exemplary group IV materials can include silicon, carbon (e.g. diamond), germanium, and combinations thereof. Various exemplary combinations of group IV materials can include silicon carbide (SiC) and silicon germanium (SiGe). In one specific aspect, the semiconductor material can be or include silicon. In another aspect, the semiconductor material can include at least one of silicon, carbon, germanium, aluminum nitride, gallium nitride, indium gallium arsenide, aluminum gallium arsenide, and combinations thereof.

Exemplary combinations of group II-VI materials can include cadmium selenide (CdSe), cadmium sulfide (CdS), cadmium telluride (CdTe), zinc oxide (ZnO), zinc selenide (ZnSe), zinc sulfide (ZnS), zinc telluride (ZnTe), cadmium zinc telluride (CdZnTe, CZT), mercury cadmium telluride (HgCdTe), mercury zinc telluride (HgZnTe), mercury zinc selenide (HgZnSe), and combinations thereof.

Exemplary combinations of group III-V materials can include aluminum antimonide (AlSb), aluminum arsenide (AlAs), aluminum nitride (AlN), aluminum phosphide (AlP), boron nitride (BN), boron phosphide (BP), boron arsenide (BAs), gallium antimonide (GaSb), gallium arsenide (GaAs), gallium nitride (GaN), gallium phosphide (GaP), indium antimonide (InSb), indium arsenide (InAs), indium nitride (InN), indium phosphide (InP), aluminum gallium arsenide (AlGaAs, $Al_xGa_{1-x}As$), indium gallium arsenide (InGaAs, $In_xGa_{1-x}As$), indium gallium phosphide (InGaP), aluminum indium arsenide (AlInAs), aluminum indium antimonide (AlInSb), gallium arsenide nitride (GaAsN), gallium arsenide phosphide (GaAsP), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide antimonide (GaInNAsSb), gallium indium arsenide antimonide phosphide (GaInAsSbP), and combinations thereof.

The semiconductor material can be of any thickness that allows electromagnetic radiation detection and conversion functionality, and thus any such thickness of semiconductor material is considered to be within the present scope. In some aspects the laser processed region of the semiconductor increases the efficiency of the device such that the semiconductor material can be thinner than has previously been possible. Decreasing the thickness of the semiconductor reduces the amount of the often costly semiconductor material required to make such a device. In one aspect, for example, the semiconductor material has a thickness of from about 500 nm to about 50 μm. In another aspect, the semiconductor material has a thickness of less than or equal to about 500 μm.

In yet another aspect, the semiconductor material has a thickness of from about 2 μm to about 10 μm.

Additionally, various types of semiconductor material are contemplated, and any such material that can be incorporated into an electromagnetic radiation detection device is considered to be within the present scope. In one aspect, for example, the semiconductor material is monocrystalline. In another aspect, the semiconductor material is multicrystalline. In yet another aspect, the semiconductor material is microcrystalline. It is also contemplated that the semiconductor material can be amorphous. Specific nonlimiting examples include amorphous silicon or amorphous selenium.

The semiconductor materials of the present disclosure can also be made using a variety of manufacturing processes. In some cases the manufacturing procedures can affect the efficiency of the device, and may be taken into account in achieving a desired result. Exemplary manufacturing processes can include Czochralski (Cz) processes, magnetic Czochralski (mCz) processes, Float Zone (FZ) processes, epitaxial growth or deposition processes, and the like. Whether or not low oxygen content is desired in the device can also affect the choice of a manufacturing process for the semiconductor material. Various processes produce semiconductor materials containing varying amounts of oxygen, and as such, some applications having more stringent tolerances with respect to oxygen levels may benefit more from specific manufacturing procedures as compared to others. For example, during CZ crystal growth oxygen from the containment vessel, usually a quartz crucible, can become incorporated into the crystal as it is pulled. Additionally, other sources of oxygen contamination are also possible with the CZ process. Such contamination may be reduced, however, through the use of non oxygen-containing crucible materials, as well as the development of other crystal growth methods that do not utilize a crucible. One such process is the FZ process.

Materials grown with the CZ method can also be made to have lowered oxygen concentration through enhancements to the crystal growth process, such as growing the crystal in the presence of a magnetic field (i.e. the mCz process). Also, gettering techniques can be employed to reduce the impact of oxygen or other impurities on the finished device. These gettering techniques can include thermal cycles to liberate or nucleate impurities, or selective ion implantation of species to serve as gettering sites for the impurities. For example, oxygen concentrated in the semiconductor can be removed by the performing a furnace cycle to form a denuded zone. During heating with an inert gas, oxygen near the surface of the semiconductor diffuses out of the material. During the furnace cycle but after the denuding step, nucleating and growing steps may be performed. Nucleating sites for precipitates are formed during the nucleating step, and the precipitates are grown from the nucleating sites during a growing step. The precipitates are formed from interstitial oxygen within the bulk of the semiconductor material and beneath the denuded zone. The precipitation of oxygen in the bulk of the semiconductor material can be desired because such precipitates can act as gettering sites. Such precipitate formation can also be performed to "lock up" interstitial oxygen into the precipitates and reduce the likelihood that such oxygen can migrates from the bulk of the semiconductor material into the denuded zone.

In those aspects where low oxygen content of the device is desired, further processing of the semiconductor material can be performed so as to minimize the introduction of oxygen. Oxygen can exist in different states or at different sites (for example, interstitially or substitutionally) within a semiconductor such as silicon, dependent upon the thermal processing the semiconductor has received. If the semiconductor is subjected to temperatures higher than, for example, about 1000° C., oxygen can form aggregates or clusters that serve as defect sites in the crystal lattice. These sites may result in trap states and a reduction in carrier lifetime within the semiconductor material and device can occur. At lower temperatures (for example, around 400° C. to 700° C.), oxygen can behave as electrically active thermal donors. Thus, oxygen can have a negative impact on carrier lifetime and on carrier mobility. In a device fabricated to have photoconductive gain, the presence of oxygen causing reduced carrier lifetime may result in reduced levels of photoconductive gain.

It may be beneficial, therefore, to produce semiconductor devices such that a low oxygen content is obtained or maintained. This can be accomplished in a variety of ways, including using semiconductor materials having low levels of oxygen contained therein to begin with, processing these materials in a manner that minimizes the uptake of oxygen into the semiconductor lattice, and utilizing techniques that eliminate or reduce oxygen that may be present in the semiconductor. Such processes and techniques can include, for example, annealing the semiconductor material and any laser treated region to lower temperatures as compared to previous annealing procedures. Annealing processes are discussed more fully below.

Additionally, laser processing of the semiconductor material and/or the annealing process can be performed in a substantially oxygen-depleted environment in order to minimize the introduction of oxygen into the semiconductor. An oxygen-depleted or substantially oxygen-depleted environment can include a variety of environments. In one aspect, for example, the oxygen-depleted environment can be an environment whereby oxygen from the air or other sources has been replaced with a gas or other fluid containing little to no oxygen. In another aspect, processing can occur in a vacuum environment, and thus contain little to no oxygen. Additionally, oxygen-containing materials or materials that introduce oxygen into the semiconductor, such as, for example, quartz crucibles, can be avoided. As a practical matter, the term "oxygen-depleted environment" can be used to describe an environment with low levels of oxygen, provided a semiconductor material can be processed therein within the desired tolerances. Thus, environments having low oxygen, or little to no oxygen, are environments in which a semiconductor can be processed as a low-oxygen content semiconductor while maintaining oxygen levels within the tolerances of the present disclosure. In one aspect, an oxygen-depleted environment can be an oxygen-free environment. Further details regarding low-oxygen content semiconductor materials can be found in U.S. patent application Ser. No. 12/771,848, filed on Apr. 30, 2010, which is incorporated herein by reference.

The semiconductor material can have varying levels of interstitial oxygen depending on the desired efficiency of the device. In some aspects, oxygen content may be of no concern, and thus any level of oxygen within the lattice is acceptable. In other aspects, a low oxygen content is desired. In one aspect a semiconductor material can have an oxygen content that is less than or equal to about 50 ppm atomic. In another aspect, a semiconductor material can have an oxygen content that is less than or equal to about 30 ppm atomic. In yet another aspect, the semiconductor material can have an oxygen content less than or equal to about 10 ppm atomic. In another aspect the semiconductor can have an oxygen content less than about 5 ppm atomic. In yet another aspect the semiconductor can have an oxygen content less than about 1 ppm atomic.

As has been described, in one aspect the semiconductor material can be annealed. In those aspects including a laser treated region, the semiconductor material can be annealed prior to laser treatment, following laser treatment, or both prior to and following laser treatment. Annealing can enhance the semiconductive properties of the device, including increasing the photoresponse properties of the semiconductor materials. Additionally, annealing can reduce damage done by the lasing process. Although any known anneal can be beneficial and would be considered to be within the present scope, annealing at lower temperatures can be particularly useful. Such a "low temperature" anneal can greatly enhance the photoconductive gain and external quantum efficiency of devices utilizing such materials. In one aspect, for example, the semiconductor material can be annealed to a temperature of from about 300° C. to about 110° C. In another aspect, the semiconductor material can be annealed to a temperature of from about 500° C. to about 900° C. In yet another aspect, the semiconductor material can be annealed to a temperature of from about 700° C. to about 800° C. In a further aspect, the semiconductor material can be annealed to a temperature that is less than or equal to about 850° C.

The duration of the annealing procedure can vary according to the specific type of anneal being performed, as well as according to the materials being used. For example, rapid annealing processes can be used, and as such, the duration of the anneal may be shorter as compared to other techniques. Various rapid thermal anneal techniques are known, all of which should be considered to be within the present scope. In one aspect, the semiconductor material can be annealed by a rapid annealing process for a duration of greater than or equal to about 1 μs. In another aspect, the duration of the rapid annealing process can be from about 1 μs to about 1 ms. As another example, a baking or furnace anneal process can be used having durations that may be longer compared to a rapid anneal. In one aspect, for example, the semiconductor material can be annealed by a baking anneal process for a duration of greater than or equal to about 1 ms to several hours. As has been described, if low oxygen content semiconductor materials are used it may be beneficial to anneal such materials in a substantially oxygen-depleted environment.

As has been described, annealing can help reduce defects inherent to the semiconductor material and otherwise reduce electron/hole recombination. In other words, the annealing can help create electron states that effectively reduce the undesirable recombination processes. Annealing the semiconductor material may also improve the responsivity or photoconductive gain of the device. Photoconductive devices can have dopants, impurities, or defects that can introduce energy levels that can trap carriers. Trapping carriers and reducing recombination of photocarriers can lead to an increase in photoconductive gain of the device. The relationship of photoconductive gain and trapping time can be represented by Equation (I):

$$\text{Gain} = \tau_L / \tau_t \quad (I)$$

where "$\tau_L$" is the lifetime of an excess carrier and "$\tau_t$" is the transit time of the carriers across the device. It is understood that the lifetime of an excess carrier can be increased by trapping a carrier species and reducing the recombination rate. An increase in gain can be achieved by trapping centers in the semiconductor that have millisecond trapping times at room temperature and short transit times in thinned lightly doped wafers. These trapping locations can decrease the recombination of carriers and therefore improve or increase the photoconductive gain of the device by allowing more electrons to traverse the different regions without being recombined. When annealed at temperatures described herein, the responsivity can be greater than 0.01 A/W at wavelengths from 0.005 nm to about 100 nm. In other embodiments the responsivity can be greater than 0.3 A/W, greater than 0.5 A/W, greater than 1 A/W, or even greater than 5 A/W at the same wavelength range.

Aspects of the present disclosure additionally provide various systems and devices that can incorporate a variety of materials described herein. For example, the electromagnetic radiation sensitive semiconductive materials of various aspects of the present disclosure can be incorporated in groups or arrays as in a photosensitive diode array. Additionally, thin-film transistors made of the presently disclosed semiconductor materials are also contemplated.

Accordingly, in one aspect, an electromagnetic radiation detecting system including a plurality of semiconductor material electromagnetic radiation detectors is provided. Such a system can include a plurality of semiconductor diodes arranged in an array capable of being operated at less than 50 volts and configured to generate a responsivity greater than 0.3 A/W at a wavelength in the range of about 0.1 nm to about 1300 nm. In some aspects, the plurality of semiconductor material electromagnetic radiation detectors can include a plurality of laser treated regions. In other aspects, such a system may include a plurality of wavelength converting devices arranged in an array configured to receive and convert electromagnetic radiation of a first wavelength to a second wavelength. The plurality of wavelength converting devices corresponds to the plurality of semiconductor materials that can include a laser treated portion arranged in an array configured to detect electromagnetic radiation. The electrical output generated from the array can be utilized generate an image.

In one aspect, the plurality of semiconductor materials can have an average size in the range of about from about 50 µm to about 500 µm to a side, assuming a square semiconductor material. Other shapes can be utilized, with an approximate size as described. In another aspect, the plurality of semiconductor materials can have an average size of greater than 50 µm. In one aspect, an array of devices can be comprised of more than 4 electromagnetic radiation detecting devices. In another aspect, the array can be comprised of more than 1000 electromagnetic radiation detecting devices, or even more than 1,000,000 electromagnetic radiation detecting devices. The more devices incorporated into the array, the greater the image resolution. In some aspects, the array can incorporate greater than 10 million electromagnetic radiation detecting devices to provide an image.

A substrate may be provided for supporting the plurality of semiconductor devices. The substrate can be comprised of a variety of materials. In one aspect, the substrate is a metal substrate that is electrically and/or thermally conductive. In another aspect, the substrate is a flexible substrate that is operable to bend and conform to various shapes. A flexible substrate can be used to conform to various body parts enabling images to be taken that can be extremely difficult with conventional techniques. In yet another aspect the substrate comprises glass. The glass substrate may incorporate a thin-film-transistor (TFT), similar to LCD displays. The TFT incorporated substrate can provide the needed switches, controls, and other circuitry to enable the semiconductor photodiodes to communicate or send electrical signals to a processing unit to create the image.

The present disclosure can further include ohmic contacts or an electrically conductive layer disposed above the semiconductor material. In one aspect, the electrically conductive layer can be comprised of indium tin oxide (ITO). ITO is electrically conductive as well as optically transparent. Accordingly, either a forward bias or reverse bias can be applied to the semiconductor material via the electrically conductive layer. Applying a bias can aid in removing either the electrons or holes collected due to either electron-hole generation or separation. Collected charge can be swept away by applying such a bias and thereby removing ghost images. A ghost image is defined as a remnant of one or more previous images due to the time it takes to dissipate charges collected in the imager.

Additionally, technologies described herein can be incorporated into a variety of imaging systems. Nonlimiting examples can include positron emission tomography (PET), computer tomography (CT), digital radiography, magnetic resonance imaging/computer tomography (MRI/CT), magnetic resonance/positron emission tomography (MRI/PET), and single-photon emission computerized tomography (SPECT) systems. The devices disclosed herein can also be incorporated into a variety of other systems that would be considered to be within the present scope.

Figure 6:
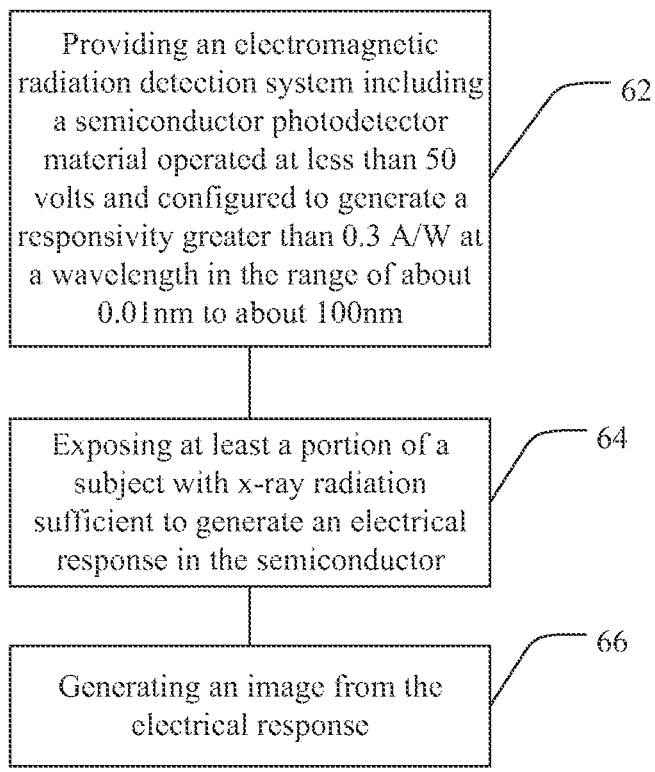
FIG. 6 is a depiction of a method of reducing electromagnetic radiation exposure to a subject in accordance with another aspect of the present disclosure.

The present disclosure additionally provides methods of imaging a subject and/or a body part of a subject. In one aspect for example, a method for reducing electromagnetic radiation exposure to a subject can include, as is shown in FIG. 6, providing an electromagnetic radiation detection system 62 including a semiconductor photodetector material operated at less than 50 volts and configured to generate a responsivity greater than 0.3 A/W at a wavelength in the range of about 0.01 nm to about 100 nm, and exposing at least a portion of a subject 64 with a sufficient amount of electromagnetic x-ray radiation to generate an electrical response within the semiconductor photodetector. The method further includes generating an image from the electrical response 66 of the semiconductor photodiode. In some aspects the semiconductor photodiodes is an array of semiconductor photodiodes.

It is well known that too much exposure to x-ray radiation over time can be detrimental to the health of an individual. Thus by allowing medical imaging to occur at lower x-ray radiation dosage levels, such detrimental health risks can be reduced. The high responsivity of the devices according to aspects of the present disclosure can provide the sensitivity needed to reduce the amount of radiation needed to achieve the same or better image results as compared to current state of the art devices at high x-ray radiation levels. In some aspects, the photosensing device can be exposed to the same amount of radiation used in current devices resulting in an increased signal to noise ratio. This increased signal to noise ratio results in higher image quality for a comparable level of radiation. Alternatively, the amount of radiation delivered through the subject to the photosensing device can be reduced while maintaining a comparable signal to noise ratio as compared to current state of the art technology, thus resulting in comparable image quality using a reduced amount of radiation. In some aspects, for example, a sufficient amount of x-ray electromagnetic radiation is about 1% to about 90% less radiation than a conventional or similar x-ray process. In one aspect, the system can reduce radiation exposure to a subject by at least 5% over conventional radiation detecting systems. In another aspect, the system can reduce radiation exposure to a subject by at least 10%. In yet another aspect, the system can reduce the radiation exposure to a subject by at least 50% over conventional systems.

As one example, a subject receiving a mammogram can be exposed to about 45 millirems (mRems) of radiation. However, a patient undergoing the same examination with a system that incorporates an electromagnetic radiation detecting device of the present disclosure may only be exposed to radiation levels in the range of about 9 millirems to about 44 millirems. This lower delivered dosage can produce images of equal or better quality as compared to conventional or similar systems and processes. This can be particularly appealing to individuals who require multiple or frequent exams, or to individuals requiring higher exposure levels of radiation due to the type of examination and the device used. For example, CT scans often expose a subject to about 6000 mrems of x-ray radiation. With the present invention CT scans can also be reduced to more acceptable levels.

Of course, it is to be understood that the above-described arrangements are only illustrative of the application of the principles of the present disclosure. Numerous modifications and alternative arrangements may be devised by those skilled in the art without departing from the spirit and scope of the present disclosure and the appended claims are intended to cover such modifications and arrangements. Thus, while the present disclosure has been described above with particularity and detail in connection with what is presently deemed to be the most practical embodiments of the disclosure, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. An electromagnetic radiation detection system, comprising:
    a silicon semiconductor material operable to detect electromagnetic radiation, the semiconductor material having a responsivity of greater than or equal to 0.01 A/W at an operating voltage of less than or equal to about 50 volts and at a wavelength of from about 0.005 nm to about 100 nm.

2. The system of claim 1, further comprising an electromagnetic radiation source positioned to deliver to the semiconductor material a quantity of electromagnetic radiation having a wavelength of from about 0.01 nm to about 100 nm.

3. The system of claim 1, wherein the semiconductor material has a responsivity of greater than or equal to 0.3 A/W at an operating voltage of less than or equal to about 50 volts and at a wavelength of from about 0.01 nm to about 50 nm.

4. The system of claim 1, wherein the semiconductor material has a responsivity of greater than or equal to 0.4 A/W at an operating voltage of less than or equal to about 50 volts and at a wavelength of from about 0.01 nm to about 100 nm.

5. The system of claim 1, wherein the semiconductor material has a responsivity of greater than or equal to 0.7 A/W at an operating voltage of less than or equal to about 50 volts and at a wavelength of from about 0.01 nm to about 100 nm.

6. The system of claim 1, wherein the operating voltage is less than or equal to about 15 volts.

7. The system of claim 1, wherein the operating voltage is less than or equal to about 10 volts.

8. The system of claim 1, wherein the semiconductor material includes a laser treated region.

9. The system of claim 8, wherein the laser treated region is doped with a dopant.

10. The system of claim 9, wherein the dopant includes a member selected from the group consisting of group II, group III, group V and group VI materials, including combinations thereof.

11. The system of claim 1, wherein the semiconductor material has an oxygen content of less than or equal to 50 ppm atomic.

12. The system of claim 1, wherein the semiconductor material has been prepared by a process selected from the group consisting of float zone (FZ), Magnetic Czochralski (MCZ), Czochralski (CZ), and combinations thereof.

13. The system of claim 1, wherein the semiconductor material has been annealed to a temperature of about 300° C. to about 1100° C.

14. The system of claim 1, wherein the semiconductor material has a thickness of from about 500 nm to about 50 μm.

15. The system of claim 1, wherein the semiconductor material has a thickness of from about 2 μm to about 10 μm.

16. A method for reducing electromagnetic radiation exposure to a subject, comprising:
    providing an electromagnetic radiation detection system including a semiconductor photodetector material operated at less than 50 volts and configured to generate a responsivity greater than 0.01 A/W at a wavelength in the range of about 0.005 nm to about 100 nm;
    exposing at least a portion of a subject with a sufficient amount of electromagnetic x-ray radiation to generate an electrical response within the semiconductor photodetector material; and
    generating an image from the electrical response of the semiconductor photodetector material.

17. The method of claim 16, wherein the sufficient amount of electromagnetic x-ray radiation is reduced by at least 5% as compared to a semiconductor photodetector material operated at greater than 50 V.

18. The method of claim 16, wherein the sufficient amount of electromagnetic x-ray radiation is reduced by at least 10% as compared to a semiconductor photodetector material operated at greater than 50 V.

19. An electromagnetic radiation detection system, comprising:
    a substrate with thin-film-transistors deposited thereon;
    at least one photodetector including a silicon semiconductor material operable to detect electromagnetic radiation in range of about 0.005 nm to about 100 nm and having a responsivity of greater than or equal to 0.1 A/W at an operating voltage of less than or equal to about 50 volts.

20. The system of claim 19, wherein the silicon semiconductor material includes at least one textured surface.

21. The system of claim 19, wherein the at least one textured surface is formed via a pulsed laser.

22. The system of claim 19, wherein the silicon semiconductor material has a responsivity of greater than about 0.01 A/W at an operating voltage of less than or equal to about 50 volts and at a wavelength in the range of about 0.01 nm to about 50 nm.

* * * * *